US009165996B2

(12) United States Patent
Choe

(10) Patent No.: US 9,165,996 B2
(45) Date of Patent: Oct. 20, 2015

(54) ORGANIC LIGHT EMITTING DISPLAY DEVICE AND MANUFACTURING METHOD THEREOF

(71) Applicant: Samsung Display Co., Ltd., Yongin, Gyeonggi-Do (KR)

(72) Inventor: Won-Kyu Choe, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 13/785,053

(22) Filed: Mar. 5, 2013

(65) Prior Publication Data

US 2014/0110674 A1    Apr. 24, 2014

(30) Foreign Application Priority Data

Oct. 19, 2012  (KR) .................. 10-2012-0116750

(51) Int. Cl.
*H01L 27/32* (2006.01)
*H01L 51/52* (2006.01)

(52) U.S. Cl.
CPC ......... *H01L 27/3279* (2013.01); *H01L 27/3246* (2013.01); *H01L 51/524* (2013.01)

(58) Field of Classification Search
CPC ............ B82Y 10/00; G09G 2320/066; G09G 3/3648; H01L 27/12; H01L 27/1214
USPC ...................................... 257/40, E51.018, 43
See application file for complete search history.

(56) References Cited

U.S. PATENT DOCUMENTS

| 6,772,429 | B2 | 8/2004 | Yoon et al. | |
| 7,495,389 | B2 | 2/2009 | Noguchi et al. | |
| 2008/0079685 | A1* | 4/2008 | Umezaki et al. | 345/100 |
| 2008/0158137 | A1* | 7/2008 | Yoshida | 345/102 |
| 2012/0162561 | A1* | 6/2012 | Kimura | 349/43 |

FOREIGN PATENT DOCUMENTS

| JP | 11-354272 A | 12/1999 |
| JP | 2002-305087 A | 10/2002 |
| KR | 10-2004-0000010 A | 1/2004 |
| KR | 10-2006-0053926 A | 5/2006 |

* cited by examiner

*Primary Examiner* — David Vu
*Assistant Examiner* — Jonathan Han
(74) *Attorney, Agent, or Firm* — Robert E. Bushnell, Esq.

(57) ABSTRACT

An organic light emitting display device and a method of manufacturing the same are proposed. The organic light emitting display device includes a display unit having a plurality of sub-pixels, each of which includes a pixel electrode and a counter electrode facing each other and a light emitting layer interposed therebetween; an encapsulation substrate, which covers the display unit; and an auxiliary electrode, which is formed on a surface of the encapsulation substrate, which faces the display unit, and is connected to the counter electrode. Using the structure, voltage drop may be effectively reduced by connecting an auxiliary electrode formed on an encapsulation substrate to a counter electrode, thereby improving reliability of an organic light emitting display device employing the same.

10 Claims, 3 Drawing Sheets

ORGANIC LIGHT EMITTING DISPLAY DEVICE AND MANUFACTURING METHOD THEREOF

CROSS-REFERENCE TO RELATED PATENT APPLICATION

This application claims the benefit of Korean Patent Application No. 10-2012-0116750, filed on Oct. 19, 2012, in the Korean Intellectual Property Office, the disclosure of which is incorporated herein in its entirety by reference.

BACKGROUND OF THE INVENTION

1. Field of the Invention

The present invention relates to an organic light emitting display device and a manufacturing method thereof, and more particularly, to an organic light emitting display device having an enhanced structure for preventing voltage drop at a counter electrode and a manufacturing method thereof.

2. Description of the Related Art

Generally, an organic light emitting display device embodies colors as holes and electrons injected by anodes and cathodes are recombined at a light emitting layer and emit light and has a stacked structure in which the light emitting layer is interposed between a pixel electrode, which is an anode, and a counter electrode, which is a cathode.

A unit pixel of such an organic light emitting display device includes sub-pixels including a red sub-pixel, a green sub-pixel, and a blue sub-pixel, where a desired color is embodied in combination of three colors of the sub-pixels. In other words, each of the sub-pixels has a structure in which a light emitting layer emitting one color from among red, green, and blue is interposed between two electrodes, and color of the unit pixel is embodied by suitably combining lights of the three colors.

Meanwhile, the counter electrode is generally formed as a thin metal film which covers all sub-pixels. However, since thickness of a metal film is inversely proportional to resistance of the metal film, voltage drop frequently occurs due to high resistance of a counter electrode.

As a result, it is difficult to embody clear images and reliability of an organic light emitting display device employing the same is deteriorated. Therefore, it is necessary to resolve the problems.

SUMMARY OF THE INVENTION

The present invention provides an organic light emitting display device having an enhanced structure for preventing voltage drop at a counter electrode and a method of manufacturing the same.

According to an aspect of the present invention, there is provided an organic light emitting display device including a display unit having a plurality of sub-pixels, each of which includes a pixel electrode and a counter electrode facing each other and a light emitting layer interposed therebetween; an encapsulation substrate, which covers the display unit; and an auxiliary electrode, which is formed on a surface of the encapsulation substrate, which faces the display unit, and is connected to the counter electrode.

A carbon nanotube is formed on the auxiliary electrode, and the auxiliary electrode and the counter electrode are connected to each other via the carbon nanotube.

A top cover layer is formed on the counter electrode, and the carbon nanotube penetrates through the top cover layer and is connected to the counter electrode.

A spacer is formed between the sub-pixels, and the carbon nanotube is formed at a location corresponding to the spacer.

The auxiliary electrode is formed of ITO, IGZO, SnO, Cu, Al, Cr, Ti, or Mo.

According to another aspect of the present invention, there is provided a method of manufacturing an organic light emitting display device, the method including forming a display unit having a plurality of sub-pixels, each of which includes a pixel electrode and a counter electrode facing each other and a light emitting layer interposed therebetween, on a base substrate; forming an encapsulation substrate, which includes an auxiliary electrode that is formed on a surface of the encapsulation substrate and is to be connected to the counter electrode; and connecting the auxiliary electrode to the counter electrode by covering the display unit with the encapsulation substrate.

The method further includes forming a carbon nanotube on the auxiliary electrode, wherein the auxiliary electrode and the counter electrode are connected to each other via the carbon nanotube The method further includes forming a top cover layer on the counter electrode, wherein the carbon nanotube penetrates through the top cover layer and is connected to the counter electrode.

The method further includes forming a spacer formed between the sub-pixels, wherein the carbon nanotube is formed at a location corresponding to the spacer.

The auxiliary electrode is formed of ITO, IGZO, SnO, Cu, Al, Cr, Ti, or Mo.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

As used herein, the term "and/or" includes any and all combinations of one or more of the associated listed items. Hereinafter, exemplary embodiments of the present invention will be described in detail with reference to the attached drawings.

Figure 1:
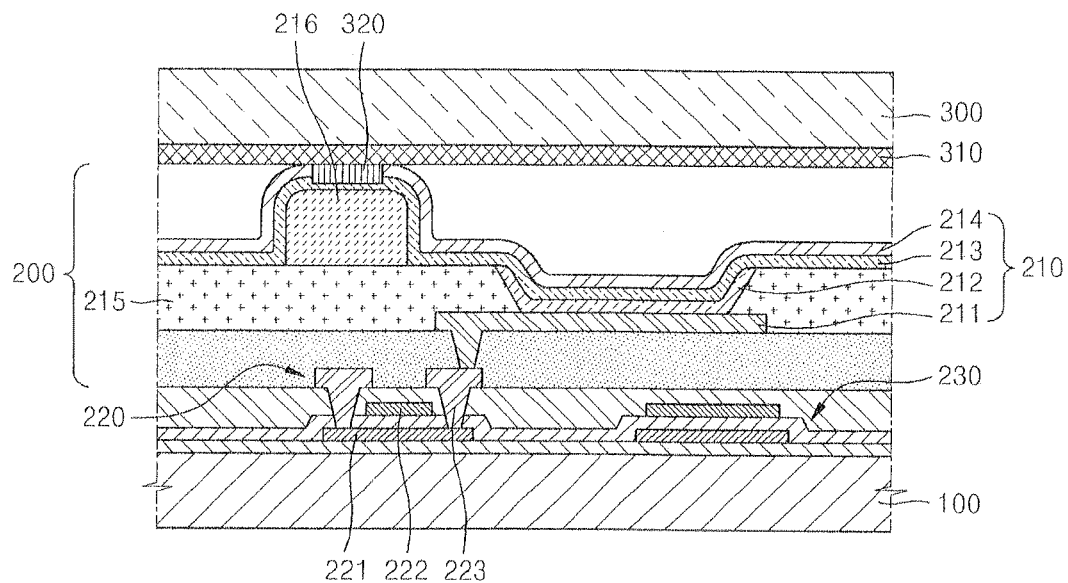
FIG. 1 is a diagram showing an organic light emitting display device according to an embodiment of the present invention.

FIG. 1 is a diagram showing an organic light emitting display device according to an embodiment of the present invention.

As shown in FIG. 1, the organic light emitting display device according to the present embodiment includes a base substrate 100, a display unit 200 formed thereon, and an encapsulation substrate 300 covering the display unit 200.

Here, the display unit 200 includes a thin-film transistor (TFT) 220, a capacitor 230, and an organic light emitting device 210. Here, FIG. 1 shows an arbitrary sub-pixel of the display unit 200 of the organic light emitting display device, and a plurality of such sub-pixels are actually arranged in rows and columns on the base substrate 100.

First, the display unit 200 includes an active layer 221 formed on the base substrate 100, a gate electrode 222 facing the active layer 221, and source and drain electrodes 223 that are respectively connected to the active layer 221 and a pixel electrode 211 of the organic light emitting device 210. Therefore, when an appropriate voltage is applied to the gate electrode 222, a current flows to the pixel electrode 211 via the active layer 221 and the source and drain electrodes 223.

Furthermore, the organic light emitting device 210 includes the active layer 221, a light emitting layer 212 formed in a pixel defining layer 215 surrounding the active layer 221, and a counter electrode 213 formed on the entire sub-pixels of the display unit 200. Therefore, when a voltage is applied by the TFT 220 to the pixel electrode 211 and a suitable voltage condition is formed between the pixel electrode 211 and the counter electrode 213, the light emitting layer 212 emits light.

In a case of a front light-emitting structure in which an image is formed in a direction toward the counter electrode 213, the pixel electrode 211 may be formed as a reflective electrode and the counter electrode 213 may be formed as a phototransmissive electrode.

The light emitting layer 212 may be formed by stacking a hole injection layer, a hole transport layer, a light emitting layer, an electron injection layer, and/or an electron transport layer. However, the light emitting layer is not optional.

The reference numeral 214 denotes a top cover layer which covers the counter electrode 213 and adjusts light path for improving light properties of the organic light emitting device 210.

Meanwhile, since the counter electrode 213 is generally formed as a thin metal film, the counter electrode 213 has high resistance, and thus voltage drop may frequently occur.

Therefore, to resolve the problem, an auxiliary electrode 310 is formed on the rear surface of the encapsulation substrate 300 to be connected to the counter electrode 213 in the present embodiment. In other words, the auxiliary electrode 310 formed of a conductive material is formed on the rear surface of the encapsulation substrate 300, which faces the counter electrode 213, such that the auxiliary electrode 310 is connected to the counter electrode 213 when the encapsulation substrate 300 is combined with the base substrate 100. As a result, a voltage may also be applied to the counter electrode 213 via the auxiliary electrode 310, and thus voltage drops at the counter electrode 213 may be significantly reduced.

However, as described above, since the counter electrode 213 is covered with the top cover layer 214, it is difficult to form a natural connection structure to the counter electrode 213 by using the auxiliary electrode 310 only. Therefore, in the present embodiment, carbon nanotube 320 is formed on the auxiliary electrode 310, such that the carbon nanotube 320 penetrates through the top cover layer 214 and are connected to the counter electrode 213. By forming the carbon nanotube 320 on the auxiliary electrode 310, electric connection between the auxiliary electrode 310 and the counter electrode 213 may be easily established even if the top cover layer 214 is arranged on the counter electrode 213.

Here, the carbon nanotube 320 is formed above a spacer 216 formed on the pixel defining layer pixel defining layer 215. In other words, the spacers 216 protrude between sub-pixels to prevent the encapsulation substrate 300 from damaging the organic light emitting device 210, where the counter electrode 213 protrude close to the encapsulation substrate 300 along the outer surfaces of the spacers 216. Therefore, a connecting structure between the auxiliary electrode 310 and the counter electrode 213 may be easily formed by forming the carbon nanotube 320 at a location corresponding to the spacer 216.

The organic light emitting display device having the structure as described above may be manufactured as described below.

Figure 2A:
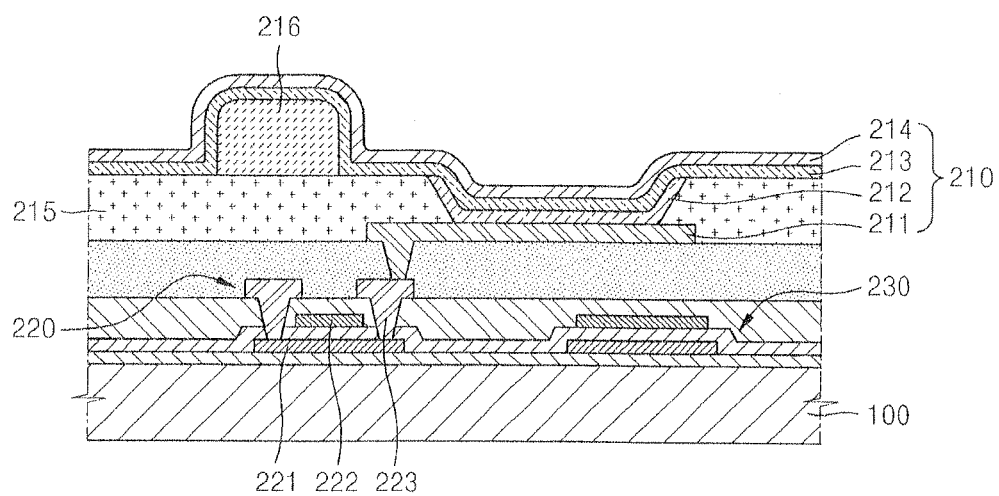
FIGS. 2A through 2E are diagrams showing operations for manufacturing the organic light emitting display device of FIG. 1.

First, as shown in FIG. 2A, the display unit 200 including the TFT 220, the organic light emitting device 210, and the capacitor 230 is formed on the base substrate 100. Since a process for forming the display unit 200 is well-known in the art, detailed descriptions thereof will be omitted.

Figure 2B:
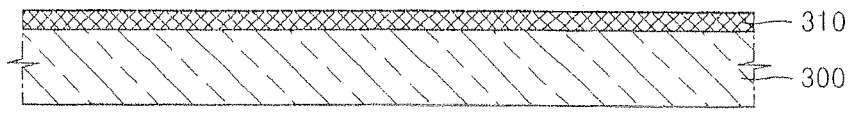

Furthermore, the encapsulation substrate 300 for covering and protecting the display unit 200 is provided, where the auxiliary electrode 310 is deposited on the rear surface of the encapsulation substrate 300 as shown in FIG. 2B. Here, the auxiliary electrode 310 may be formed of a transparent conductive oxide, such as ITO, IGZO, or SnO, or a metal, such as Cu, Al, Cr, Ti, or Mo.

Figure 2C:
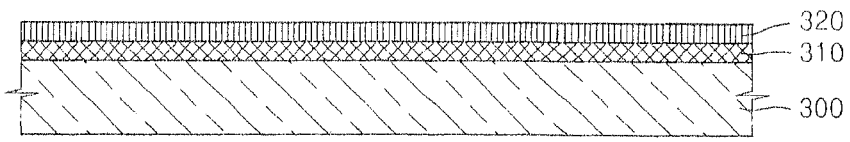
Figure 2D:
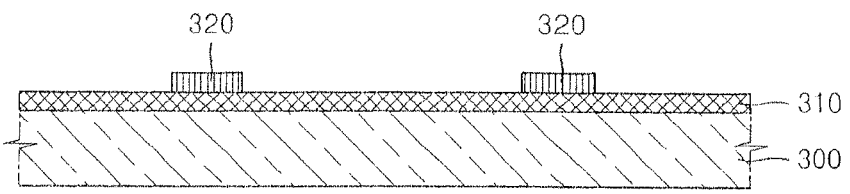

Next, the carbon nanotube 320 is formed on the auxiliary electrode 310 as shown in FIG. 2C, and the carbon nanotubes 320 is patterned, such that only a portion corresponding to the spacer 216 remains as shown in FIG. 2D.

Figure 2E:
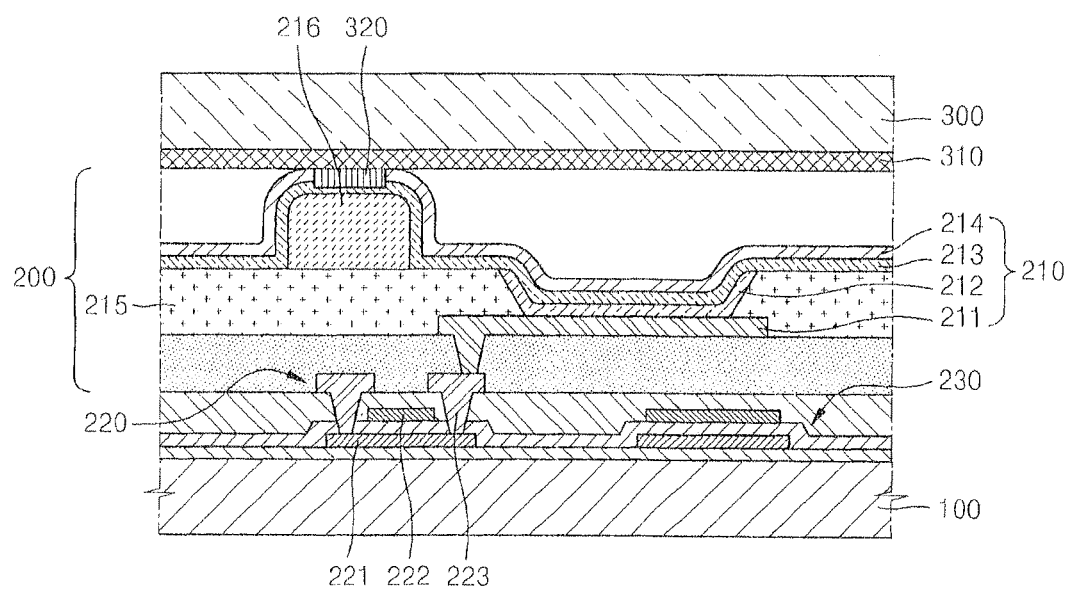

Next, as the encapsulation substrate 300 is combined with the base substrate 100, the carbon nanotubes 320 penetrates through the top cover layer 214 and contacts the counter electrode 213 as shown in FIG. 2E, and thus the auxiliary electrode 310 and the counter electrode 213 are electrically connected. The material of the top cover layer 214 may be an organic material having a density equal to or lower than 1 g/cm$^3$.

In the structure described above, a voltage may also be applied to the counter electrode 213 via the auxiliary electrode 310, and thus voltage drop at the counter electrode 213 may be prevented.

Figure 3A:
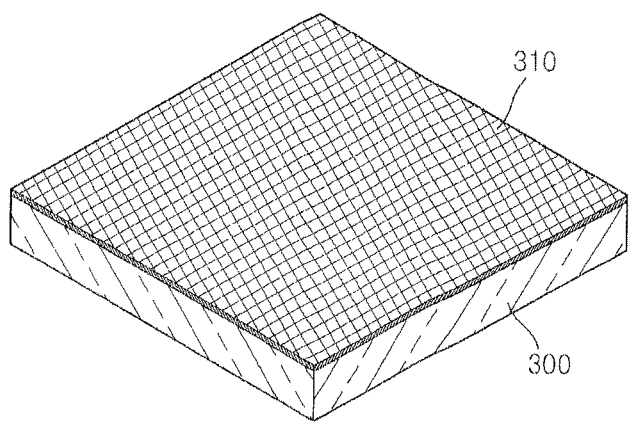
FIGS. 3A and 3B are diagrams showing modified embodiments of an auxiliary electrode of the organic light emitting display device of FIG. 1.
Figure 3B:
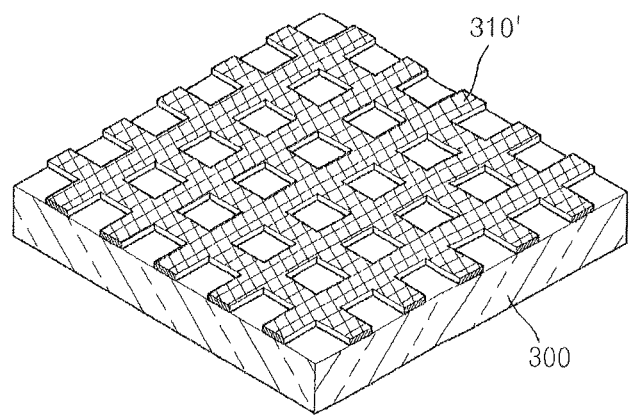

Meanwhile, although the auxiliary electrode 310 is formed to cover the entire rear surface of the encapsulation substrate 300 in the present embodiment as shown in FIG. 3A, the auxiliary electrode 310 may also be formed as an auxiliary electrode 310' that is patterned to a lattice shape as shown in FIG. 3B. In other words, shape of the auxiliary electrode 310 may vary.

Therefore, according to embodiments of the present invention as described above, voltage drop may be effectively reduced by connecting an auxiliary electrode formed on an encapsulation substrate to a counter electrode, thereby improving reliability of an organic light emitting display device employing the same.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display device comprising:
   a display unit having a plurality of sub-pixels, each of which includes a pixel electrode and a counter electrode facing each other and a light emitting layer interposed therebetween;
   an encapsulation substrate, which covers the display unit; and
   an auxiliary electrode formed on a surface of the encapsulation substrate, which faces the display unit, the auxiliary electrode connected to the counter electrode.

2. The organic light emitting display device of claim 1, comprising a carbon nanotube formed on the auxiliary electrode, the auxiliary electrode and the counter electrode being connected to each other via the carbon nanotube.

3. The organic light emitting display device of claim 2, comprising a top cover layer formed on the counter electrode, the carbon nanotube penetrating through the top cover layer and being connected to the counter electrode.

4. The organic light emitting display device of claim 3, comprising a spacer formed between the sub-pixels, the carbon nanotube being formed at a location corresponding to the spacer.

5. The organic light emitting display device of claim 1, wherein the auxiliary electrode is formed of ITO, IGZO, SnO, Cu, Al, Cr, Ti, or Mo.

6. A method of manufacturing an organic light emitting display device, the method comprising:

forming a display unit having a plurality of sub-pixels, each of which includes a pixel electrode and a counter electrode facing each other and a light emitting layer interposed therebetween, on a base substrate;

forming an encapsulation substrate, which includes an auxiliary electrode that is formed on a surface of the encapsulation substrate and is to be connected to the counter electrode; and connecting the auxiliary electrode to the counter electrode by covering the display unit with the encapsulation substrate.

7. The method of claim 6, further comprising forming a carbon nanotube on the auxiliary electrode, wherein the auxiliary electrode and the counter electrode are connected to each other via the carbon nanotube.

8. The method of claim 7, further comprising forming a top cover layer on the counter electrode, wherein the carbon nanotube penetrates through the top cover layer and is connected to the counter electrode.

9. The method of claim 8, further comprising forming a spacer formed between the sub-pixels, wherein the carbon nanotube is formed at a location corresponding to the spacer.

10. The method of claim 6, wherein the auxiliary electrode is formed of ITO, IGZO, SnO, Cu, Al, Cr, Ti, or Mo.

* * * * *